(12) United States Patent
Zhu et al.

(10) Patent No.: US 11,818,875 B2
(45) Date of Patent: Nov. 14, 2023

(54) METHODS FOR FORMING MEMORY AND MEMORY

(71) Applicant: CHANGXIN MEMORY TECHNOLOGIES, INC., Anhui (CN)

(72) Inventors: Xiao Zhu, Hefei (CN); Yi-Hsiang Chen, Hefei (CN); Lihui Yang, Hefei (CN); Hung-I Lin, Hefei (CN); Yun-Chieh Mi, Hefei (CN); Jinfeng Gong, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 159 days.

(21) Appl. No.: 17/310,646

(22) PCT Filed: Apr. 1, 2021

(86) PCT No.: PCT/CN2021/085094
§ 371 (c)(1),
(2) Date: Aug. 16, 2021

(87) PCT Pub. No.: WO2021/204064
PCT Pub. Date: Oct. 14, 2021

(65) Prior Publication Data
US 2022/0320104 A1    Oct. 6, 2022

(30) Foreign Application Priority Data
Apr. 8, 2020 (CN) .......................... 202010277791.8

(51) Int. Cl.
*H10B 12/00* (2023.01)

(52) U.S. Cl.
CPC ....... *H10B 12/0335* (2023.02); *H10B 12/315* (2023.02); *H10B 12/34* (2023.02); *H10B 12/482* (2023.02)

(58) Field of Classification Search
CPC .............. H10B 12/0335; H10B 12/315; H10B 12/10814; H10B 12/482; H01L 27/10855; H01L 27/10814
See application file for complete search history.

(56) References Cited

U.S. PATENT DOCUMENTS

| 6,100,138 A | 8/2000 | Tu |
|---|---|---|
| 7,435,677 B2 | 10/2008 | Choi |

(Continued)

FOREIGN PATENT DOCUMENTS

| CN | 208738215 U | 4/2019 |
|---|---|---|
| CN | 110364484 A | 10/2019 |

OTHER PUBLICATIONS

International Search Report in Application No. PCT/CN2021/085094, dated Jul. 8, 2021.

*Primary Examiner* — Robert G Bachner
*Assistant Examiner* — Molly K Reida
(74) *Attorney, Agent, or Firm* — SYNCODA LLC; Feng Ma (57) ABSTRACT

A method for forming a memory includes: providing a substrate, a plurality of discrete bit line structures being located on the substrate, and an area surrounded by the adjacent bit line structures and the substrate and having a central axis; forming, on the substrate, a first conductive film filling an area between the adjacent bit line structures; etching the first conductive film by a first etching process to form a first conductive layer; forming a second conductive film on the top surface of the first conductive layer; and etching the second conductive film and the first conductive layer by a second etching process, the remaining second conductive film and the first conductive layer forming a capacitive contact window.

17 Claims, 4 Drawing Sheets

(56) References Cited

U.S. PATENT DOCUMENTS

| | | |
|---|---|---|
| 8,865,545 B2 | 10/2014 | Kwon |
| 2015/0126013 A1* | 5/2015 | Hwang ................ H10B 12/315 438/672 |
| 2019/0181141 A1* | 6/2019 | Lee .................... H10B 12/0387 |
| 2019/0296019 A1* | 9/2019 | Wu ........................ H10B 12/50 |
| 2022/0223597 A1* | 7/2022 | Gong .................... H10B 12/03 |

* cited by examiner

METHODS FOR FORMING MEMORY AND MEMORY

CROSS-REFERENCE TO RELATED APPLICATIONS

This application is a national stage of International Application No. PCT/CN2021/085094 filed on Apr. 1, 2021, which claims priority to Chinese Patent Application No. 202010277791.8 filed on Apr. 8, 2020. The disclosures of these applications are hereby incorporated by reference in their entirety.

TECHNICAL FIELD

The present application relates to the field of semiconductors, and in particular to a method for forming a memory and a memory.

BACKGROUND

As the feature sizes and line widths of dynamic random-access memory (DRAM) continue to decrease, the spacing between adjacent bit line structures is getting smaller. As the spacing between adjacent bit line structures gets smaller, the aspect ratio of a capacitive contact hole between adjacent bit line structures increases, which will affect the morphological features of the subsequently formed capacitive contact window.

In a case where the capacitive contact hole has a high aspect ratio, how to form a capacitive contact window with a good top morphology to reduce the resistance of the capacitive contact window is an urgent problem to be solved at present.

SUMMARY

Embodiments of the present application provide a method for forming a memory and a memory. In a case where the capacitive contact hole has a high aspect ratio, a capacitive contact window with a relatively flat top morphology is formed.

In order to solve the technical problem, an embodiment of the present application provides a method for forming a memory, comprising: providing a substrate, a plurality of discrete bit line structures being located on the substrate, and an area surrounded by the adjacent bit line structures and the substrate and having a central axis; forming, on the substrate, a first conductive film filling an area between the adjacent bit line structures; etching the first conductive film by a first etching process to form a first conductive layer, the thickness of the first conductive layer, in a direction from sidewalls of the bit line structure to the central axis, gradually decreases in a direction perpendicular to the surface of the substrate; forming a second conductive film on the top surface of the first conductive layer; and etching the second conductive film and the first conductive layer by a second etching process, the remaining second conductive film and the first conductive layer forming a capacitive contact window, and, by the second etching process, the etching rate for the second conductive film being less than the etching rate for the first conductive layer.

Due to the high aspect ratio of the capacitive contact hole, there is a gap in the directly-filled first conductive film. During the formation of the first conductive film, the top between adjacent bit line structures will be sealed in advance, resulting in recesses in the top morphology of the capacitive contact window formed by etching, which leads to high resistance of the capacitive contact window. By etching the first conductive film, due to the gap, the top surface of the first conductive layer formed after etching is higher at the edge and lower in the middle. Then, a second conductive film is formed on the top of the first conductive layer. The second conductive film fills the recesses on the top of the first conductive layer. Due to the first conductive layer at the bottom, equivalently, with a reduced aspect ratio, no gap will be generated in the second conductive film formed in this case. Moreover, the etching rate for the second conductive film by the second etching process is less than the etching rate for the first conductive layer by the second etching process, so that the top surface of the capacitive contact window formed by etching is relatively flat, thereby reducing the resistance of the capacitive contact window.

In addition, etching the second conductive film and the first conductive layer by a second etching process comprises: etching, in a first step of the etching process, the second conductive film until the first conductive layer is exposed; and etching, in a second step of the etching process, the second conductive film and the exposed first conductive layer, the etching rate for the second conductive film in the second step of the etching process being less than the etching rate for the first conductive layer.

In addition, the height of the capacitive contact window is between the heights of the top surface and the height of the bottom surface of a metal layer in the bit line structure.

In addition, the forming, on the substrate, a first conductive film filling an area between the adjacent bit line structures comprises: forming, on the substrate, a first conductive film filling an area between the adjacent bit line structures and covering the top surface of the bit line structure, a gap being formed in the first conductive film within the area.

In addition, after the first etching process is performed, the first conductive layer has a hole; and in the step of forming the second conductive film, the second conductive film fills the hole.

In addition, the height of the top surface of the first conductive film is at least 20 nm higher than the height of the top surface of the bit line structure.

In addition, the forming a second conductive film on the top surface of the first conductive layer comprises: forming, on the top surface of the first conductive layer, a second conductive film covering the top surface of the bit line structure.

In addition, the forming, on the top surface of the first conductive layer, a second conductive film covering the top surface of the bit line structure comprises: depositing an initial second conductive film on the top surface of the first conductive layer, the height of the top surface of the initial second conductive film being higher than the height of the top surface of the bit line structure; and flattening the initial second conductive film to form the second conductive film.

In addition, the height of the top surface of the first conductive film is at least 20 nm higher than the height of the top surface of the bit line structure.

In addition, the etching gas used in the first etching process comprises chlorine gas, and the flow rate of the etching gas ranges from 20 sccm to 60 sccm.

In addition, the process parameters of the second etching process are the same as the process parameters of the first etching process.

In addition, the material for the first conductive film is a first semiconductor material doped with first ions, and the material for the second conductive film is a second semiconductor material doped with second ions or a non-doped second semiconductor material, the doping concentration of the first ion being greater than the doping concentration of the second ion.

In addition, the difference in doping concentration between the first ion and the second ion ranges from 30 Atoms/cm³ to 70 Atoms/cm³. The doping concentration of the first ion ranges from 50 Atoms/cm³ to 500 Atoms/cm³; and the doping concentration of the second ion ranges from 0 Atoms/cm³ to 450 Atoms/cm³.

An embodiment of the present application also provides a memory, comprising: a substrate, a plurality of discrete bit line structures being located on the substrate, and an area surrounded by the adjacent bit line structures and the substrate and having a central axis; a capacitive contact window, located on the substrate between the bit line structures; wherein the capacitive contact window is composed of a part of the second conductive film and a part of the first conductive layer, the top surface of the part of the first conductive layer has a hole, and the part of the second conductive film fills the hole formed on the top surface of the part of the first conductive layer.

In addition, the material for the first conductive film is a first semiconductor material doped with first ions, and the material for the second conductive film is a second semiconductor material doped with second ions or a non-doped second semiconductor material, the doping concentration of the first ion being greater than the doping concentration of the second ion. The difference in doping concentration between the first ion and the second ion ranges from 30 Atoms/cm³ to 70 Atoms/cm³.

Compared with the related art, in a case where the capacitive contact hole has a high aspect ratio, by the capacitive contact window with a relatively flat top surface, the contact area is increased, thereby reducing the resistance of the capacitive contact window.

DETAILED DESCRIPTION

At present, in a case where the capacitive contact hole has a high aspect ratio, how to form a capacitive contact window with a good top morphology to reduce the resistance of the capacitive contact window is an urgent problem to be solved at present.

In order to solve the problem, an embodiment of the present application provides a method for forming a memory, comprising: providing a substrate, a plurality of discrete bit line structures being located on the substrate, and an area surrounded by the adjacent bit line structures and the substrate and having a central axis; forming, on the substrate, a first conductive film filling an area between the adjacent bit line structures; etching the first conductive film by a first etching process to form a first conductive layer, the thickness of the first conductive layer, in a direction from sidewalls of the bit line structure to the central axis, gradually decreases in a direction perpendicular to the surface of the substrate; forming a second conductive film on the top surface of the first conductive layer; and etching the second conductive film and the first conductive layer by a second etching process, the remaining second conductive film and the first conductive layer forming a capacitive contact window, and, by the second etching process, the etching rate for the second conductive film being less than the etching rate for the first conductive layer.

To make the objectives, technical solutions and advantages of the embodiments of the present application clearer, the embodiments of the present application will be further described below in detail with reference to the accompanying drawings. However, it may be understood by a person of ordinary skill in the art that, in the embodiments of the present application, many technical details are provided for the better understanding of the present application. However, the technical solutions sought to be protected by the present application can be implemented, even without these technical details and various changes and modifications based on the following embodiments. The following divisions of the various embodiments are for convenience of description, and should not constitute any limitation to the specific implementation of the present application, and the various embodiments may be combined with each other if not conflict.

FIGS. 1 to 7 are schematic cross-sectional structure diagrams corresponding to steps of the method for forming a memory according to an embodiment of the present application. The method for forming a memory in this embodiment will be specifically described below.

Figure 1:
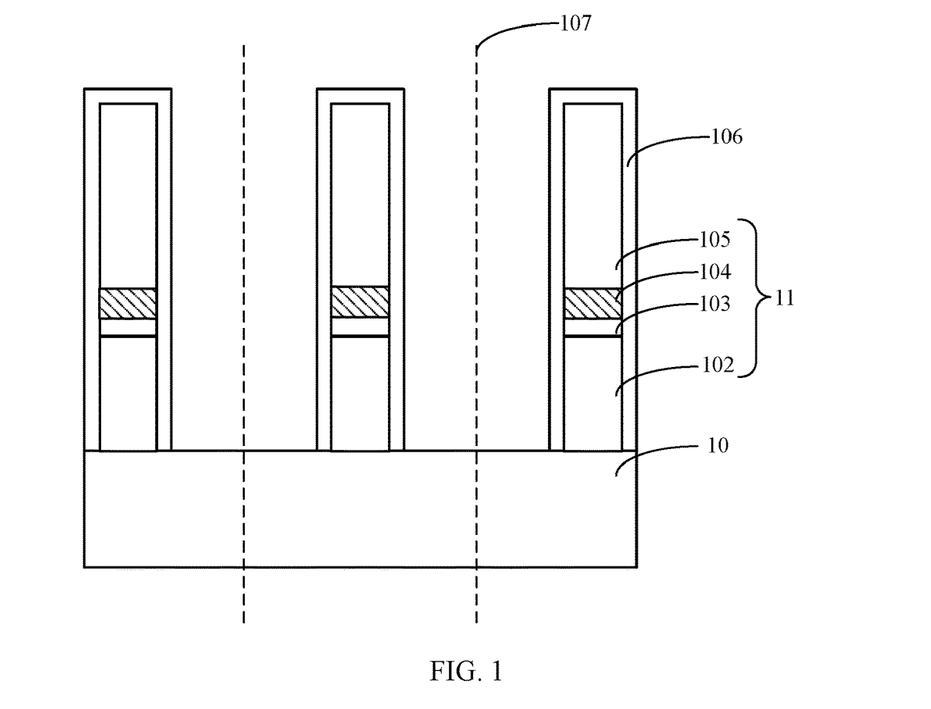
FIG. 1 is a first schematic cross-sectional structure diagram corresponding to a step of the method for forming a memory according to an embodiment of the present application.

Referring to FIG. 1, a substrate 10 is provided. The substrate 10 has a plurality of discrete bit line structures 11, and an area surrounded by the adjacent bit line structures 11 and the substrate 10, and the area has a central axis 107.

The substrate 10 comprises structures such as buried word lines, shallow trench isolation structures, and active regions. The bit line structure 11 comprises a bit line contact layer 102, a bottom dielectric layer 103, a metal layer 104, and a top dielectric layer 105 stacked in sequence. The material for the bit line contact layer 102 comprises tungsten or polycrystalline silicon. The material for the bottom dielectric layer 103 and the top dielectric layer 105 comprises silicon nitride, silicon dioxide, or silicon oxynitride. The metal layer 104 may be made of a conductive material or a variety of conductive materials, such as doped polycrystalline silicon, titanium, titanium nitride, tungsten and tungsten composites.

The area surrounded by the adjacent bit line structure 11 and the substrate 10 is used as a capacitive contact hole for subsequent formation of a capacitive contact window. The capacitive contact hole has a central axis 107, and the distance from the central axis 107 to two adjacent bit line structures is equal.

In this embodiment, a protective layer 106 is covered on the top surface and sidewalls of the bit line structure 11, and the protective layer 106 is used to protect and isolate the bit line structure 11.

In this embodiment, the protective layer 106 is formed by an atomic layer deposition process. The atomic layer deposition process has the characteristics of slow deposition rate, high density of the deposited film and good step coverage. In this way, the protective layer 106 can, with a small thickness, effectively isolate the adjacent bit line structures 11, thereby preventing the protective layer 106 from occupying the small space between the adjacent bit line structures 11, which is helpful to realize the subsequent filling of the first conductive film and the second conductive film. The material for the protective layer 106 comprises silicon nitride or silicon oxynitride.

Figure 2:
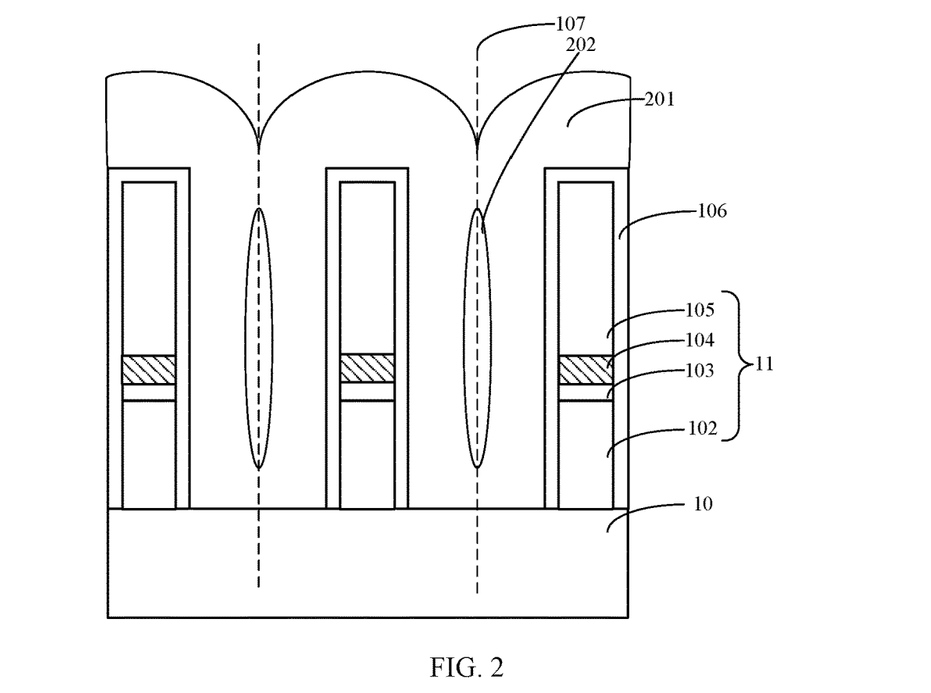
FIG. 2 is a second schematic cross-sectional structure diagram corresponding to a step of the method for forming a memory according to an embodiment of the present application.

Referring to FIG. 2, a first conductive film 201 is formed on the substrate 10. The first conductive film 201 fills an area between adjacent bit line structures 11, and a gap 202 is formed in the first conductive film 201 within the area.

In this embodiment, a first conductive film 201 filling an area between the adjacent bit line structures 11 and covering the top surface of the bit line structure 11 is formed on the substrate 10, so that the first conductive film 201 fills the area between adjacent bit line structures. Specifically, the height of the top surface of the first conductive film 201 is at least 20 nm higher than the height of the top surface of the bit line structure 11, to ensure that the area between the bit line structures 11 is filled with the first conductive film 201.

The process of forming the first conductive film 201 comprises a chemical vapor deposition process or an atomic layer deposition process. Since the top surface of the first conductive film 201 to be formed needs to be higher than the top surface of the bit line structure 11 and the thickness is relatively large, forming the first conductive film 201 by the chemical vapor deposition process with a fast deposition rate is helpful to shorten the period of the manufacturing process.

Specifically, the material for the first conductive film 201 is a first semiconductor material doped with first ions; the first semiconductor material comprises polycrystalline silicon or amorphous silicon; and the first ions comprise phosphorus ions. It should be noted that the introduction of the first semiconductor material and the material for the first ion in this embodiment is to allow those skilled in the art to understand the implementation details of the technical solution, and does not constitute any limitation to the technical solution.

The doping concentration of the first ion ranges from 50 Atoms/cm$^3$ to 500 Atoms/cm$^3$. It should be noted that the introduction of the doping concentration of the first ion in this embodiment is to allow those skilled in the art to understand the implementation details of the technical solution, and does not constitute any limitation to the technical solution.

It should be noted that, in other embodiments, the first conductive film may be formed only in the area between the bit line structures, rather than covering the top surface of the bit line structure.

Due to the small spacing between adjacent bit line structures 11 and the high aspect ratio of the capacitive contact hole between adjacent bit line structures 11, during the formation of the first conductive film 201, the top between adjacent bit line structures 11 will be sealed in advance, resulting in a gap 202 at the central axis 107.

Since the first conductive film 201 is uniformly deposited on the substrate 10, the gap 202 will appear at the same distance from the adjacent bit line structures 11, that is, the gap 202 is located on the central axis 107.

Figure 3:
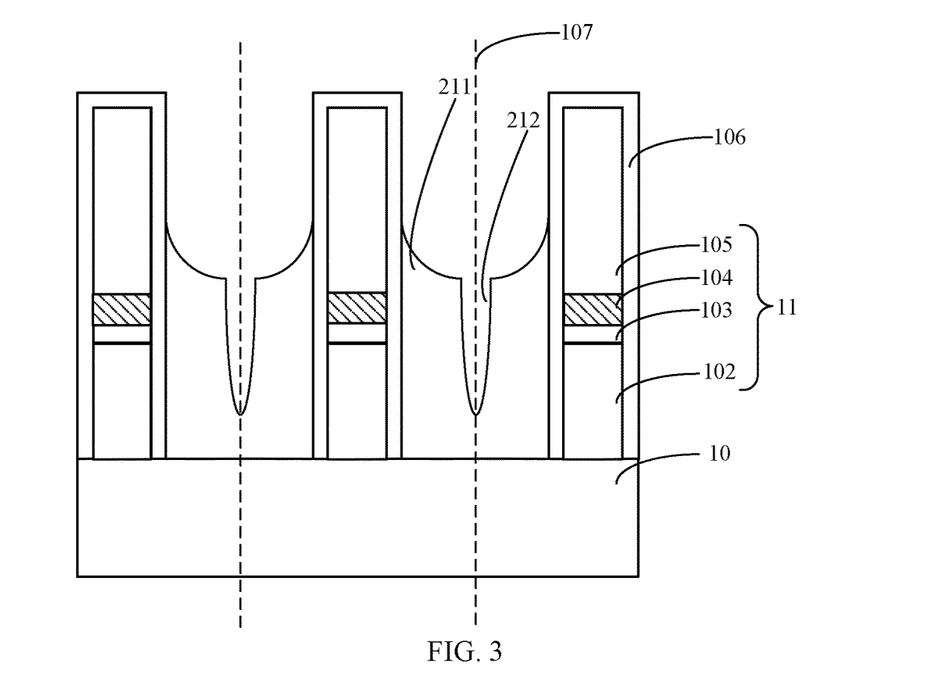
FIG. 3 is a third schematic cross-sectional structure diagram corresponding to a step of the method for forming a memory according to an embodiment of the present application.

Referring to FIG. 3, the first conductive film 201 is etched by a first etching process to form a first conductive layer 211, the thickness of which, in a direction from sidewalls of the bit line structure 11 to the central axis 107, gradually decreases in a direction perpendicular to the surface of the substrate 10.

Specifically, since the first conductive film 201 has a gap 202 (see FIG. 2), the top surface of the first conductive layer 211 formed by etching has a hole 212. Due to the high aspect ratio of the capacitive contact hole, the etching rate for what near the central axis 107 of the first conductive film 201 by the same etching material is greater than the etching rate for the first conductive film. Regardless of the hole 212, in this case, the height of the middle of the top surface of the first conductive film 211 is lower than the height of the edge. Moreover, due to the hole 212, the top morphology as shown in FIG. 3 is formed.

In this embodiment, the etching gas used in the first etching process is chlorine gas, and the flow rate of the etching gas ranges from 20 sccm to 60 sccm, for example 30 sccm, 40 sccm, or 50 sccm.

Figure 4:
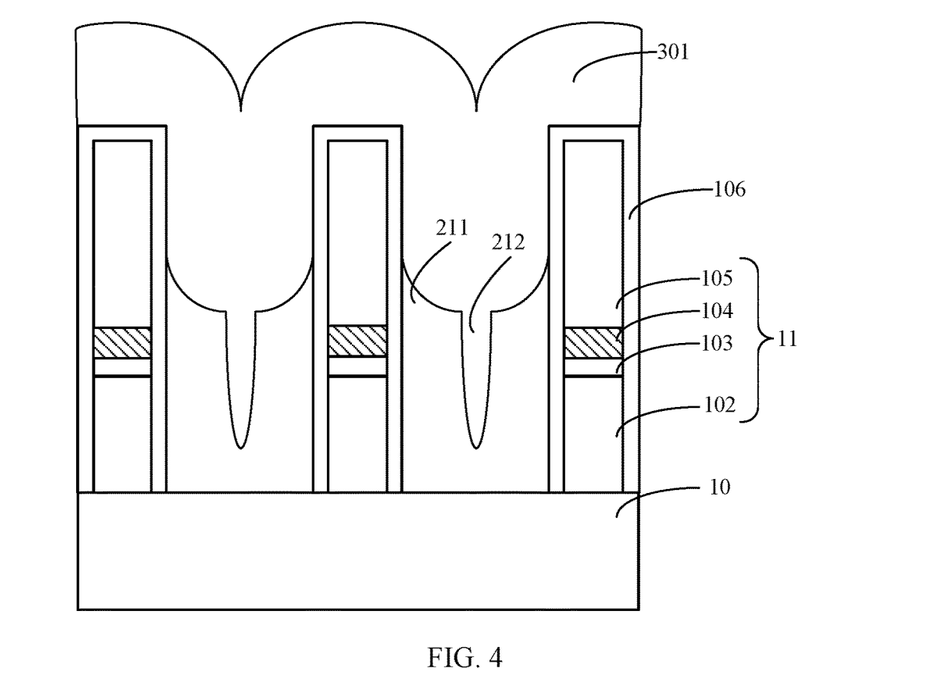
FIG. 4 is a fourth schematic cross-sectional structure diagram corresponding to a step of the method for forming a memory according to an embodiment of the present application.
Figure 5:
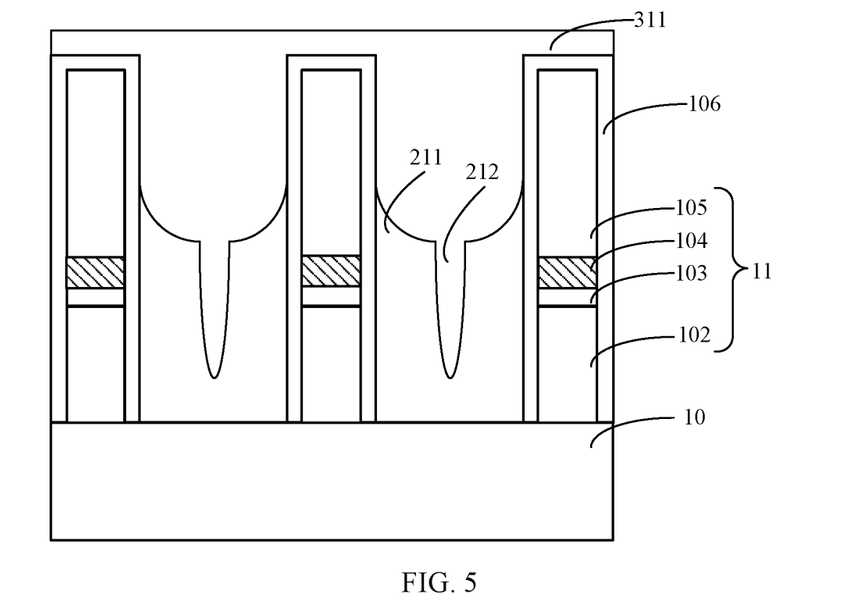
FIG. 5 is a fifth schematic cross-sectional structure diagram corresponding to a step of the method for forming a memory according to an embodiment of the present application.

Referring to FIGS. 4 and 5, a second conductive film 311 is formed on the top surface of the first conductive layer 211.

Specifically, the material for the second conductive film 311 is a second semiconductor material doped with second ions or a non-doped second semiconductor material; the second semiconductor material comprises polycrystalline silicon or amorphous silicon; and the second ions comprise phosphorus ions. It should be noted that the introduction of the second semiconductor material and the material for the second ion in this embodiment is to allow those skilled in the art to understand the implementation details of the technical solution, and does not constitute any limitation to the technical solution.

The doping concentration of the second ion ranges from 0 Atoms/cm$^3$ to 450 Atoms/cm$^3$. It should be noted that the introduction of the doping concentration of the second ion in this embodiment is to allow those skilled in the art to understand the implementation details of the technical solution, and does not constitute any limitation to the technical solution.

Referring to FIG. 4, in this embodiment, a second conductive film 311 covering the bit line structure 11 is formed on the top surface of the first conductive layer 211, and the second conductive film 311 fills the hole 212.

Specifically, an initial second conductive film 301 is deposited on the top surface of the first conductive layer 211, and the height of the top surface of the initial second conductive film 301 is at least 20 nm higher than the height of the top surface of the bit line structure 11, to ensure that the area between the bit line structures 11, the hole 212 on the top of the first conductive layer 211 is filled. Due to the first conductive layer 211 at the bottom of the capacitive contact hole, equivalently, with a reduced aspect ratio of the capacitive contact hole, no gap will be generated in the initial second conductive film 301 formed in this case.

The process of forming the initial second conductive film 301 comprises a chemical vapor deposition process or an atomic layer deposition process. Since the top surface of the initial second conductive film 301 to be formed needs to be higher than the top surface of the bit line structure 11 and the thickness is relatively large, forming the initial second conductive film 301 by the chemical vapor deposition process with a fast deposition rate is helpful to shorten the period of the manufacturing process.

It should be noted that, in other embodiments, the initial second conductive film may be formed only in the area between the bit line structures, rather than covering the top surface of the bit line structure.

Referring to FIG. 5, the initial second conductive film 301 (see FIG. 4) is flattened to form the second conductive film 311.

Specifically, the top of the initial second conductive film 301 is polished by chemical mechanical polishing to form the second conductive film 311 with a relatively flat top surface. Compared with the etching process, the chemical mechanical polishing has a higher removal rate, which is helpful to shorten the process period.

Figure 6:
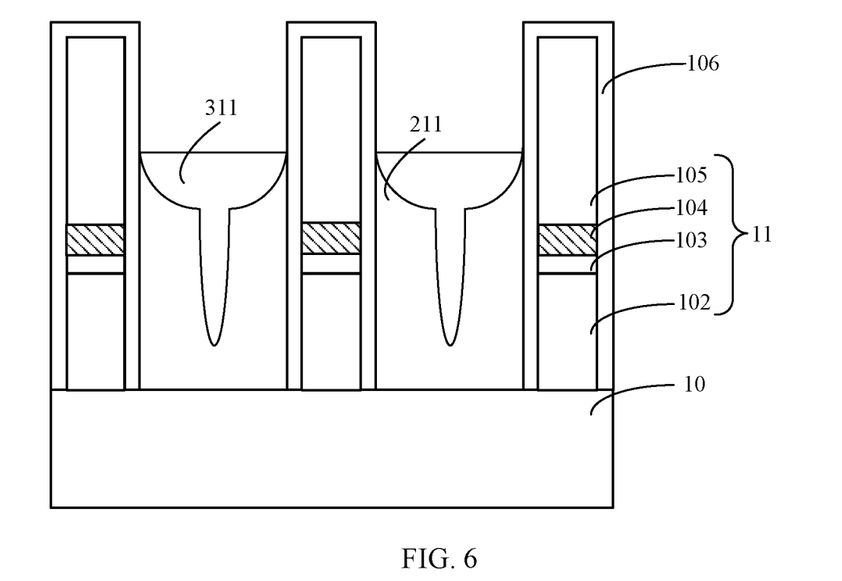
FIG. 6 is a sixth schematic cross-sectional structure diagram corresponding to a step of the method for forming a memory according to an embodiment of the present application.
Figure 7:
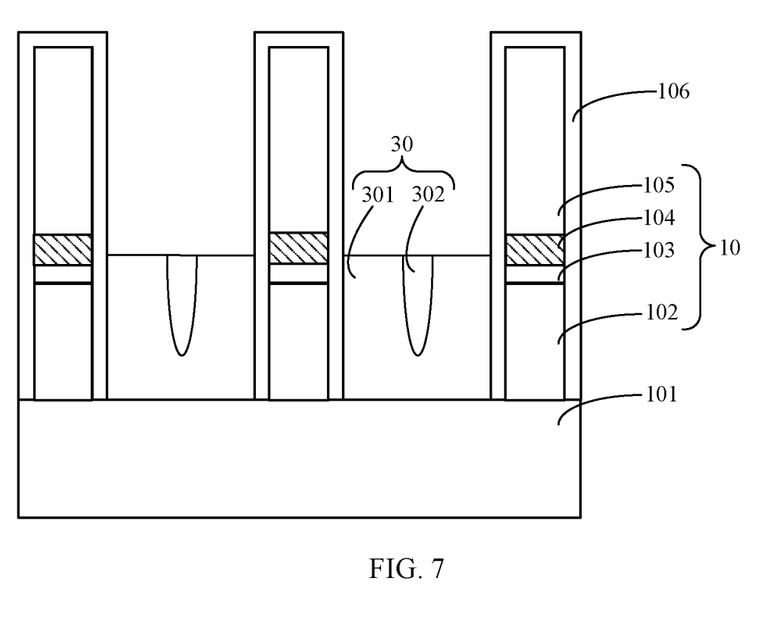
FIG. 7 is a seventh schematic cross-sectional structure diagram corresponding to a step of the method for forming a memory according to an embodiment of the present application.

Referring to FIGS. 6 and 7, the second conductive film 311 and the first conductive layer 211 are etched by a second etching process, the remaining second conductive film 302 and the first conductive layer 301 forming a capacitive contact window 30, and the etching rate for the second conductive film 311 by the second etching process being less than the etching rate for the first conductive layer 211.

In the field of semiconductors, the greater the doping concentration of the material to be etched, the faster the etching rate for this material to be etched by the same etching material. In this embodiment of the present application, by controlling the doping concentration of the first conductive film 201 material to be greater than the doping concentration of the second conductive film 311 material, the etching rate for the second conductive film 311 by the second etching process is less than the etching rate for the first conductive layer 211.

In this embodiment, the etching rate for the first conductive layer 211 and the second conductive film 311 by the second etching process is controlled by the materials for the first conductive layer 211 and the second conductive film 311.

Specifically, the doping concentration of the first ion is greater than the doping concentration of the second ion; wherein the difference in doping concentration between the first ion and the second ion ranges from 30 Atoms/cm$^3$ to 70 Atoms/cm$^3$, for example 40 Atoms/cm$^3$, 50 Atoms/cm$^3$, or 60 Atoms/cm$^3$.

Referring to FIG. 6, in a first step of the etching process, the second conductive film 311 is etched until the first conductive layer 211 is exposed.

The first step of the etching process is to etch only the second conductive film 311. Due to the first conductive layer 211 at the bottom, the aspect ratio of the capacitive contact hole is reduced. In this case, since there is only a small difference between the etching rate for the second conductive film 311 at the edge of the bit line structure 11 and the etching rate for the second conductive film 311 at the central axis 107 by the same etching material, and the etching depth is low, a relatively flat surface may still be formed by etching.

Referring to FIG. 7, in a second step of the etching process, the second conductive film 311 and the exposed first conductive layer 211 are etched, and the etching rate for the second conductive film 311 in the second step of the etching process is less than the etching rate for the second conductive film 211.

The second step of the etching process is to etch both the second conductive film 311 and the first conductive layer 211. Due to the high aspect ratio of the capacitive contact hole, the etching rate for a same material to be etched at the central axis 107 by the same etching material is greater than the etching rate for this material on sidewalls of the bit line structure 11. In this case, by the second step of the etching process, the difference between the etching rate for the second conductive film 311 and the etching rate for the first conductive layer 211 is compensated, so that the capacitive contact window 30 formed after etching has a relatively flat top morphology. In this embodiment, the height of the capacitive contact window 30 is between the heights of the top surface and the height of the bottom surface of a metal layer 104 in the bit line structure 11.

It should be noted that, in other embodiments, the height of the capacitive contact window may be the same as the height of the metal layer.

In this embodiment, the process parameters of the second etching process are the same as the process parameters of the first etching process. It should be noted that, it may be understood by those skilled in the art that the description of the parameters of the second etching process in this embodiment is to clearly introduce the embodiment of the present application, and does not constitute any limitation to the process parameters of the second etching process. In the specific embodiments, any parameters should be within the protection scope of the present application as long as a similar etching step is used.

Compared with the related art, by etching the first conductive film, due to the gap, the top surface of the first conductive layer formed after etching is higher at the edge and lower in the middle. Then, a second conductive film is formed on the top of the first conductive layer. The second conductive film fills the recesses on the top of the first conductive layer. Due to the first conductive layer at the bottom, equivalently, with a reduced aspect ratio, no gap will be generated in the second conductive film formed in this case. Moreover, the etching rate for the second conductive film by the second etching process is less than the etching rate for the first conductive layer by the second etching process, so that the top surface of the capacitive contact window formed by etching is relatively flat, thereby reducing the resistance of the capacitive contact window.

The division of the steps above is just for clarity of description. When implemented, the steps may be combined into one step or some steps may be split and decomposed into multiple steps, as long as they include the same logical relationship, without departing from the scope of the present application. Adding insignificant modifications to the process or introducing insignificant designs without changing the key design of the process are within the protection scope of the present application.

Another embodiment of the present application relates to a memory.

Referring to FIG. 7, the memory in this embodiment will be described in detail below with reference to the accompanying drawings. The parts that are the same as or corresponding to the above-mentioned embodiment will not be described in detail below.

A memory is provided, comprising: a substrate 10, a plurality of discrete bit line structures 11 being located on the substrate 10, and an area surrounded by the adjacent bit line structures 11 and the substrate 10 and having a central axis; a capacitive contact window 30, located on the substrate 10 between the bit line structures 11; wherein the capacitive contact window 30 is composed of a part of the second conductive film 302 and a part of the first conductive layer 301, the top surface of the part of the first conductive layer 301 has a hole, and the part of the second conductive film 302 fills the hole formed on the top surface of the part of the first conductive layer 301.

In this embodiment, the height of the capacitive contact window 30 is between the heights of the top surface and the height of the bottom surface of a metal layer 104 in the bit line structure 11. It should be noted that, in other embodiments, the height of the capacitive contact window may be the same as the height of the metal layer.

Specifically, the material for the first conductive film 201 is a first semiconductor material doped with first ions, and the material for the second conductive film 311 is a second semiconductor material doped with second ions or a non-doped second semiconductor material, the doping concentration of the first ion being greater than the doping concentration of the second ion.

In the field of semiconductors, the greater the doping concentration of the material to be etched, the faster the etching rate for this material to be etched by the same etching material. In this embodiment of the present application, by controlling the doping concentration of the first conductive film 201 material to be greater than the doping concentration of the second conductive film 311 material, a capacitive contact window 30 with a relatively flat top morphology is formed.

Specifically, in this embodiment, the first semiconductor material comprises polycrystalline silicon or amorphous silicon, the second semiconductor material comprises polycrystalline silicon or amorphous silicon, the first ions comprise phosphorus ions, and the second ions comprise phosphorus ions.

The difference in doping concentration between the first ion and the second ion ranges from 30 Atoms/cm$^3$ to 70 Atoms/cm$^3$, and the doping concentration of the first ion ranges from 50 Atoms/cm$^3$ to 500 Atoms/cm$^3$; and the doping concentration of the second ion ranges from 0 Atoms/cm$^3$ to 450 Atoms/cm$^3$.

Compared with the related art, in a case where the capacitive contact holes have a high aspect ratio, by the capacitive contact window with a relatively flat top surface, the contact area is increased, thereby reducing the resistance of the capacitive contact window.

Since the above embodiment and this embodiment correspond to each other, this embodiment may be implemented in cooperation with the above embodiment. The relevant technical details mentioned in the above embodiment are still applicable to this embodiment, and the technical effects that can be achieved in the above embodiment can also be achieved in this embodiment. For the purpose of clarity, they will not be repeated here. Correspondingly, related technical details mentioned in this embodiment are applicable to the above embodiment.

It can be understood by a person of ordinary skill in the art that the above embodiments are specific embodiments for realizing the present application, and in actual applications, various changes may be made to the form and details without departing from the spirit and scope of the present application.

What is claimed is:

1. A method for forming a memory, comprising:
   providing a substrate, a plurality of discrete bit line structures being located on the substrate, and an area surrounded by the adjacent bit line structures and the substrate and having a central axis;
   forming, on the substrate, a first conductive film filling an area between the adjacent bit line structures;
   etching the first conductive film by a first etching process to form a first conductive layer, the thickness of the first conductive layer, in a direction from sidewalls of the bit line structure to the central axis, gradually decreases in a direction perpendicular to the surface of the substrate;
   forming a second conductive film on the top surface of the first conductive layer; and
   etching the second conductive film and the first conductive layer by a second etching process, the remaining second conductive film and the first conductive layer forming a capacitive contact window, and, by the second etching process, the etching rate for the second conductive film being less than the etching rate for the first conductive layer.

2. The method for forming a memory according to claim 1, wherein said etching the second conductive film and the first conductive layer by a second etching process comprises:
   etching, in a first step of the etching process, the second conductive film until the first conductive layer is exposed; and
   etching, in a second step of the etching process, the second conductive film and the exposed first conductive layer, the etching rate for the second conductive film in the second step of the etching process being less than the etching rate for the first conductive layer.

3. The method for forming a memory according to claim 2, wherein a height of the capacitive contact window is between a height of a top surface and a height of a bottom surface of a metal layer in the bit line structure.

4. The method for forming a memory according to claim 1, wherein a height of the capacitive contact window is between the heights of the top surface and the height of the bottom surface of a metal layer in the bit line structure.

5. The method for forming a memory according to claim 1, wherein the forming, on the substrate, a first conductive film filling an area between the adjacent bit line structures comprises: forming, on the substrate, a first conductive film filling an area between the adjacent bit line structures and covering the top surface of the bit line structure, a gap being formed in the first conductive film within the area.

6. The method for forming a memory according to claim 5, wherein, after the first etching process is performed, the first conductive layer has a hole; and in a step of forming the second conductive film, the second conductive film fills the hole.

7. The method for forming a memory according to claim 5, wherein a height of the top surface of the first conductive film is at least 20 nm higher than the height of the top surface of the bit line structure.

8. The method for forming a memory according to claim 1, wherein the forming a second conductive film on the top surface of the first conductive layer comprises: forming, on the top surface of the first conductive layer, a second conductive film covering the top surface of the bit line structure.

9. The method for forming a memory according to claim 8, wherein the forming, on the top surface of the first conductive layer, a second conductive film covering the top surface of the bit line structure comprises:
   depositing an initial second conductive film on the top surface of the first conductive layer, the height of the top surface of the initial second conductive film being higher than the height of the top surface of the bit line structure; and
   flattening the initial second conductive film to form the second conductive film.

10. The method for forming a memory according to claim 9, wherein a height of the top surface of the initial second conductive film is at least 20 nm higher than the height of the top surface of the bit line structure.

11. The method for forming a memory according to claim 1, wherein the etching gas used in the first etching process comprises chlorine gas, and the flow rate of the etching gas ranges from 20 sccm to 60 sccm.

12. The method for forming a memory according to claim 1, wherein process parameters of the second etching process are same as process parameters of the first etching process.

13. The method for forming a memory according to claim 1, wherein a material for the first conductive film is a first semiconductor material doped with first ions, and a material for the second conductive film is a second semiconductor material doped with second ions or a non-doped second semiconductor material, a doping concentration of the first ion being greater than a doping concentration of the second ion.

14. The method for forming a memory according to claim 13, wherein a difference in doping concentration between the first ion and the second ion ranges from 30 Atoms/cm$^3$ to 70 Atoms/cm$^3$.

15. The method for forming a memory according to claim 14, wherein the doping concentration of the first ion ranges from 50 Atoms/cm$^3$ to 500 Atoms/cm$^3$; and the doping concentration of the second ion ranges from 0 Atoms/cm$^3$ to 450 Atoms/cm$^3$.

16. A memory, comprising:
a substrate, a plurality of discrete bit line structures being located on the substrate, and an area surrounded by the adjacent bit line structures and the substrate and having a central axis;
a capacitive contact window, located on the substrate between the bit line structures;
wherein the capacitive contact window is composed of a part of a second conductive film and a part of a first conductive layer, a top surface of the part of the first conductive layer has a hole, and the part of the second conductive film fills the hole formed on the top surface of the part of the first conductive layer;
a material for a first conductive film is a first semiconductor material doped with first ions, and a material for the second conductive film is a second semiconductor material doped with second ions or a non-doped second semiconductor material, a doping concentration of the first ion being greater than a doping concentration of the second ion; and
a height of the capacitive contact window is between a height of a top surface and a height of a bottom surface of a metal layer in the bit line structure.

17. The memory according to claim 16, wherein a difference in doping concentration between the first ion and the second ion ranges from 30 Atoms/cm$^3$ to 70 Atoms/cm$^3$.

* * * * *